(12) United States Patent
Li

(10) Patent No.: US 11,508,785 B2
(45) Date of Patent: Nov. 22, 2022

(54) DISPLAY PANEL AND DISPLAY DEVICE FOR IMPROVING TOUCH EFFECTS

(71) Applicant: WUHAN CHINA STAR OPTOELECTRONICS SEMICONDUCTOR DISPLAY TECHNOLOGY CO., LTD., Hubei (CN)

(72) Inventor: Yuanhang Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 252 days.

(21) Appl. No.: 16/962,237

(22) PCT Filed: May 11, 2020

(86) PCT No.: PCT/CN2020/089573
§ 371 (c)(1),
(2) Date: Jul. 15, 2020

(87) PCT Pub. No.: WO2021/203510
PCT Pub. Date: Oct. 14, 2021

(65) Prior Publication Data
US 2021/0320153 A1    Oct. 14, 2021

(30) Foreign Application Priority Data

Apr. 8, 2020   (CN) .......................... 202010270422.6

(51) Int. Cl.
*H01L 29/08* (2006.01)
*H01L 27/32* (2006.01)
*H01L 51/56* (2006.01)

(52) U.S. Cl.
CPC ...... *H01L 27/3211* (2013.01); *H01L 27/3244* (2013.01); *H01L 51/56* (2013.01)

(58) Field of Classification Search
CPC .................................................. H01L 27/3211
See application file for complete search history.

(56) References Cited

U.S. PATENT DOCUMENTS

2002/0158337 A1* 10/2002 Babich ................ H01L 21/7681
                                                     257/750
2004/0127001 A1*  7/2004 Colburn ............. H01L 23/5222
                                                     438/586

(Continued)

FOREIGN PATENT DOCUMENTS

CN         103019496 A         4/2013
CN         103914183 A         7/2014
(Continued)

*Primary Examiner* — Caleb E Henry
(74) *Attorney, Agent, or Firm* — Mark M. Friedman

(57) ABSTRACT

A display panel and a display device are provided. The display panel includes a light-emitting layer, a first insulation layer, a first metal layer, a second insulation layer, and a second metal layer. The first metal layer includes a bridging layer and a first floating pattern. The second metal layer includes a driving electrode and a sensing electrode disposed in a same layer. This prevents a fracture structure and improves display effects and product performance of the display device.

15 Claims, 3 Drawing Sheets

(56) References Cited

U.S. PATENT DOCUMENTS

| | | | |
|---|---|---|---|
| 2005/0062165 A1* | 3/2005 | Saenger | H01L 23/5222 438/622 |
| 2005/0208752 A1* | 9/2005 | Colburn | H01L 23/5329 438/619 |
| 2007/0259516 A1* | 11/2007 | Jahnes | H01L 21/76835 438/618 |
| 2011/0285640 A1* | 11/2011 | Park | G02F 1/13338 349/122 |
| 2012/0026128 A1 | 2/2012 | Chen et al. | |
| 2018/0348912 A1* | 12/2018 | Lee | H01L 51/5237 |
| 2018/0348932 A1* | 12/2018 | Lee | G06F 3/0443 |
| 2018/0348948 A1* | 12/2018 | Lee | H01L 51/5253 |
| 2019/0204975 A1 | 7/2019 | Xie et al. | |
| 2020/0201483 A1 | 6/2020 | Feng | |

FOREIGN PATENT DOCUMENTS

| | | |
|---|---|---|
| CN | 105808005 A | 7/2016 |
| CN | 206292748 U | 6/2017 |
| CN | 107066160 A | 8/2017 |
| CN | 109407893 A | 3/2019 |
| CN | 109669572 A | 4/2019 |
| CN | 109992160 A | 7/2019 |
| JP | 2013171454 A | 9/2013 |

\* cited by examiner

DISPLAY PANEL AND DISPLAY DEVICE FOR IMPROVING TOUCH EFFECTS

TECHNICAL FIELD

The present disclosure relates to a technical field for manufacturing displays, and more particularly, to a display panel and a display device.

BACKGROUND

Currently, with continuous improvement and rapid development of touch and sensing technologies, touch panels have been widely used in various display devices.

In a touch display field, touch panels include touch structures such as external touch structures and embedded touch structures (in-cell type or on-cell type), and the on-cell structures are favored because of their high touch accuracy. For on-cell touch panels, they usually include a driving electrode and a sensing electrode. When the driving electrode and the sensing electrode are disposed, they are often disposed as metal grid structures in the prior art. Meanwhile, a fracture structure is disposed between the driving electrode and the sensing electrode. The driving electrode, the sensing electrode, and a floating block are isolated from each other by the fracture structure, ensuring touch functions while also ensuring consistency of optical effects of a display panel. However, when disposing the fracture structure, a fracture width is not easy to be controlled. If the fracture width is too narrow, it easily causes a short circuit between the electrodes and the floating block, thereby causing abnormal electrode channel capacitance. If the fracture width is too wide, it is not conducive to a design of the display panel, ultimately affecting a yield of products.

Therefore, it is necessary to propose solutions to problems of the prior art.

Technical Problem

In summary, in existing preparation technology, when designing touch electrodes, there is an unreasonable arrangement between a driving electrode and a sensing electrode. Meanwhile, a fracture structure disposed between the electrodes easily causes a short circuit inside products, ultimately affecting normal display of a display panel and reduces a yield of products.

Technical Solution

To the solve above-mentioned problems, the present disclosure provides a display panel and a display device. In order to solve the problems that an arrangement between a driving electrode and a sensing electrode is unreasonable, a fracture structure disposed between the electrodes easily causes a short circuit inside products, electrode channel capacitance of the products is affected, normal display of a display panel is affected, and a yield of the products is reduced.

To solve the above-mentioned technical problems, technical solutions provided by embodiments of the present disclosure are:

According to a first aspect of an embodiment of the present disclosure, a display panel is provided, and the display panel comprises:

a light-emitting layer;

a first insulation layer, disposed on the light-emitting layer;

a first metal layer, disposed on the first insulation layer;

a second insulation layer, disposed on the first insulation layer and covering the first metal layer; and a second metal layer, disposed on the second insulation layer, wherein the first metal layer comprises a bridging layer and a first floating pattern, the bridging layer and the first floating pattern are insulated from each other, the second metal layer comprises a driving electrode and a sensing electrode, the driving electrode and the sensing electrode are disposed in a same layer, and the driving electrode is electrically connected to the sensing electrode via the bridging layer; and a via structure, wherein the bridging layer is connected to the driving electrode and the sensing electrode by the via structure.

According to one embodiment of the present disclosure, wherein the driving electrode and the sensing electrode are arranged as a corresponding convex-concave structure in an interaction area where the driving electrode and the sensing electrode intersect.

According to one embodiment of the present disclosure, wherein a protrusion or a depression of the convex-concave structure is greater than 400 um in depth and is greater than 200 um in width.

According to one embodiment of the present disclosure, the display panel further comprising a separating area, wherein the separating area is disposed between the driving electrode and the sensing electrode corresponding to the interaction area.

According to one embodiment of the present disclosure, wherein a width of the separating area is 10 um to 100 um.

According to one embodiment of the present disclosure, wherein the driving electrode or the sensing electrode comprises a touch electrode with a grid structure and a second floating pattern of the grid structure, and the touch electrode and the second floating pattern are insulated from each other.

According to one embodiment of the present disclosure, wherein the grid structure is shaped as a diamond, a circle, or a triangle.

According to one embodiment of the present disclosure, wherein the second floating pattern is disposed in an area corresponding to the bridging layer.

According to one embodiment of the present disclosure, wherein the first floating pattern overlaps with a projection of the second floating pattern corresponding to the first floating pattern on the first metal layer.

According to a second aspect of an embodiment of the present disclosure, a display panel is further provided, the display panel comprises:

a light-emitting layer;

a first insulation layer, disposed on the light-emitting layer;

a first metal layer, disposed on the first insulation layer;

a second insulation layer, disposed on the first insulation layer and covering the first metal layer; and a second metal layer, disposed on the second insulation layer, wherein the first metal layer comprises a bridging layer and a first floating pattern, the bridging layer and the first floating pattern are insulated from each other, the second metal layer comprises a driving electrode and a sensing electrode, the driving electrode and the sensing electrode are disposed in a same layer, and the driving electrode is electrically connected to the sensing electrode via the bridging layer.

According to one embodiment of the present disclosure, wherein the driving electrode and the sensing electrode are arranged as a corresponding convex-concave structure in an interaction area where the driving electrode and the sensing electrode intersect.

According to one embodiment of the present disclosure, wherein a protrusion or a depression of the convex-concave structure is greater than 400 um in depth and is greater than 200 um in width.

According to one embodiment of the present disclosure, the display panel further comprises a separating area, wherein the separating area is disposed between the driving electrode and the sensing electrode corresponding to the interaction area.

According to one embodiment of the present disclosure, wherein a width of the separating area is 10 um to 100 um.

According to one embodiment of the present disclosure, wherein the driving electrode or the sensing electrode comprises a touch electrode with a grid structure and a second floating pattern of the grid structure, and the touch electrode and the second floating pattern are insulated from each other.

According to one embodiment of the present disclosure, wherein the grid structure is shaped as a diamond, a circle, or a triangle.

According to one embodiment of the present disclosure, wherein the second floating pattern is disposed in an area corresponding to the bridging layer.

According to one embodiment of the present disclosure, wherein the first floating pattern overlaps with a projection of the second floating pattern corresponding to the first floating pattern on the first metal layer.

According to a third aspect of an embodiment of the present disclosure, a display device is further provided, the display device comprises:

a light-emitting layer;

a first insulation layer, disposed on the light-emitting layer;

a first metal layer, disposed on the first insulation layer;

a second insulation layer, disposed on the first insulation layer and covering the first metal layer; and a second metal layer, disposed on the second insulation layer, wherein the first metal layer comprises a bridging layer and a first floating pattern, the bridging layer and the first floating pattern are insulated from each other, the second metal layer comprises a driving electrode and a sensing electrode, the driving electrode and the sensing electrode are disposed in a same layer, and the driving electrode is electrically connected to the sensing electrode via the bridging layer.

According to one embodiment of the present disclosure, wherein the driving electrode and the sensing electrode are arranged as a corresponding convex-concave structure in an interaction area where the driving electrode and the sensing electrode intersect.

Beneficial Effect

In summary, a beneficial effect of embodiments of the present disclosure is:

The embodiments of the present disclosure provide a display panel and a display device. When disposing a driving electrode and a sensing electrode of the display panel, the driving electrode and the sensing electrode are disposed in a same layer, and the driving electrode is further electrically connected to the sensing electrode via a bridging layer. Meanwhile, in an interaction area where the driving electrode and the sensing electrode intersect, a convex-concave structure is disposed to increase an area used for touching and sensing in the interaction area to improve touch effects. In the embodiments of the present disclosure, structures of touch electrodes and uniformity of capacitance in a panel are good. Meanwhile, it will not cause a short circuit between the touch electrodes, or between insides of the electrodes and a floating pattern, and the display device has better display effects and a product has excellent performance.

DETAILED DESCRIPTION OF PREFERRED EMBODIMENTS

The following descriptions for the respective embodiments are specific embodiments capable of being implemented for illustrating the present disclosure with referring to the appending figures.

Currently, on-cell touch display panels have better transmittance than external touch panels, and have characteristics of bending resistance, lightness, and thinness, etc., making them widely used for their good comprehensive performance. In a structure of the on-cell touch display panels, arrangement of a touch electrode and a sensing electrode are critical to touch performance. However, in an existing design, an intersection area of the touch driving electrode and the touch sensing electrode is often designed as a fracture structure, and the fracture structure easily causes problems such as short circuits inside the touch display panel and abnormal electrode capacitance values.

Figure 1:
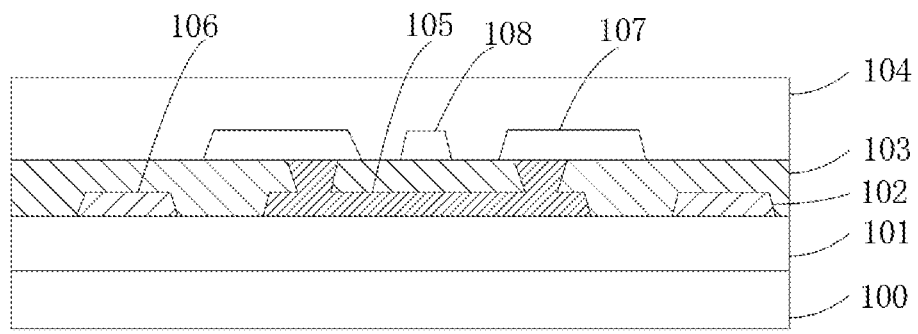
FIG. 1 is a schematic diagram showing a display panel according to an embodiment of the present disclosure.

An embodiment of the present disclosure provides a display panel, as shown in FIG. 1, it is a schematic diagram showing a structure of the display panel according to the embodiment of the present disclosure. The display panel includes a substrate 100, a first insulation layer 101, a first metal layer 102, a second insulation layer 103, a second metal layer 107, and a planarization layer 104.

Specifically, the first insulation layer 101 is disposed on the substrate 100, the first metal layer 102 is disposed on the first insulation layer 101, and the second insulation layer 103 is disposed on the first insulation layer 101 and covers the first metal layer 102. Meanwhile, the second metal layer 107 is disposed on the second insulation layer 103, and the planarization layer 104 is disposed on the second metal layer 107 and covers the second metal layer 107.

In the embodiment of the present disclosure, the substrate 100 may be a light-emitting layer, and specifically is a light-emitting display layer of the display panel, and touch operations are performed on the display panel by a touch layer located on the substrate 100. Preferably, the light-emitting layer may further include an array substrate, a light-emitting device layer, and an encapsulation layer. The light-emitting device layer is disposed on the array substrate, and the encapsulation layer is disposed on the light-emitting device layer to constitute a main light-emitting film layer and a display film layer structure of the display panel.

Preferably, in the embodiment of the present disclosure, in order to realize a touch function, a touch electrode and a metal pattern structure of the touch electrode are formed by the first metal layer 102 and the second metal layer 107. Specifically, the first metal layer 102 further includes a bridging layer 105 and a first floating pattern 106. The bridging layer 105 and the first floating pattern 106 are insulated from each other.

A driving electrode and a sensing electrode are included in the second metal layer 107. When disposing the driving electrode and the sensing electrode, the driving electrode layer and the sensing electrode layer are disposed in a same film layer, and the driving electrode is electrically connected to the sensing electrode via the bridging layer 105.

Wherein, materials of the first metal layer 102 and the second metal layer 107 may be TiAl, Mo, or other metals or alloys with low impedance to ensure a touch effect and improve touch sensitivity of the touch layer.

Materials of the first insulation layer 101 and the second insulation layer 103 may include materials with high transmittance and high dielectric constant such as SiNx, SiOx, and SiON, so as to achieve better insulation performance.

Specifically, a via structure may be disposed, and the bridging layer 105 is connected to the driving electrode and the sensing electrode by the via structure at a bridging point. In the embodiment of the present disclosure, the driving electrode and the sensing electrode include touch electrodes with grid structures and second floating patterns of the grid structures, and each of the floating patterns is insulated from each other. The second floating pattern may be disposed on an area corresponding to the bridging layer 105.

Preferably, in the embodiment of the present disclosure, the grid structure is shaped as a diamond, a circle, a triangle, or other shapes, and the grid structure is mainly used for improving light transmittance of the display panel and ensuring display effects of the display panel.

Figure 2:
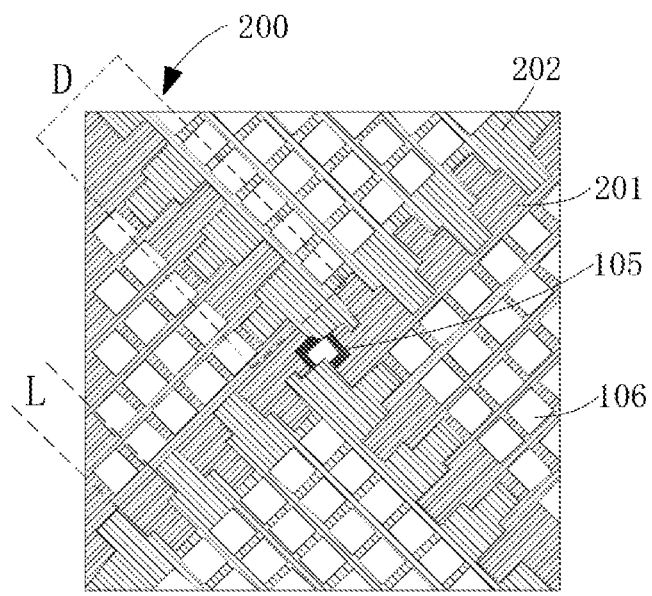
FIG. 2 is a schematic diagram showing a structure of a touch electrode pattern according to an embodiment of the present disclosure.

The diamond-shaped grid structure of the touch electrode is used as an example for description in the embodiment of the present disclosure, and working rules of the grid structure with another shape is same as the working rules of the embodiment of the present disclosure, and will not be described in detail. As shown in FIG. 2, it is a schematic diagram showing a structure of a touch electrode pattern according to an embodiment of the present disclosure, and is in conjunction with the film layer structure of the display panel shown in FIG. 1. In the touch electrode pattern, the bridging layer 105 and the first floating pattern 106 are included in the first metal layer 102, and the driving electrode 201 and the sensing electrode 202 are included in the second metal layer 107. Furthermore, an area above the first floating pattern 106 corresponding to the driving electrode 201 and the sensing electrode 202 is a blank area, and a corresponding area above the bridging layer 105 is also the bridging blank area. That is, a bridging point pattern of the bridging layer 105 overlaps with a projection of the second metal layer 107 corresponding to the bridging layer 105 in the corresponding bridging point blank area along a vertical direction, and the first floating pattern 106 of the first metal layer 102 overlaps with a projection of a corresponding second floating pattern of the second metal layer 107 in the vertical direction.

Preferably, in the embodiment of the present disclosure, the first floating pattern 106 may be a square structure uniformly arranged in an array, or may be a structure with another shape arranged in a fragmented arrangement. The first floating pattern 106 is mainly a floating electrode, and the floating electrode corresponds to the second floating pattern of the second metal layer 107, wherein the bridging layer 105 and the first floating pattern 106 are both disposed in the first metal layer 102.

The driving electrode 201 and the sensing electrode 202 are arranged as a corresponding convex-concave structure in an interaction area 200. The preferred convex-concave structure may be shaped as a zigzag or wave. By shaping the convex-concave structure as the zigzag or wave to increase an interaction area of the driving electrode 201 and the sensing electrode 202 at an area where the driving electrode and the sensing electrode intersect, the touch effects are thereby improved and the short circuit between the two electrodes may be effectively prevented.

In the embodiment of the present disclosure, the convex-concave structure shaped as the zigzag is used as an example for description. When disposing the convex-concave structure, a depth of the zigzag structure D is greater than 400 um, and a width of the zigzag structure L is greater than 200 um. When the depth and the width of the zigzag structure are within above ranges, it may ensure better touch effects between the touch electrodes. Furthermore, the driving electrode 201 is electrically connected to the sensing electrode 202 by the bridging layer 105.

Figure 3:
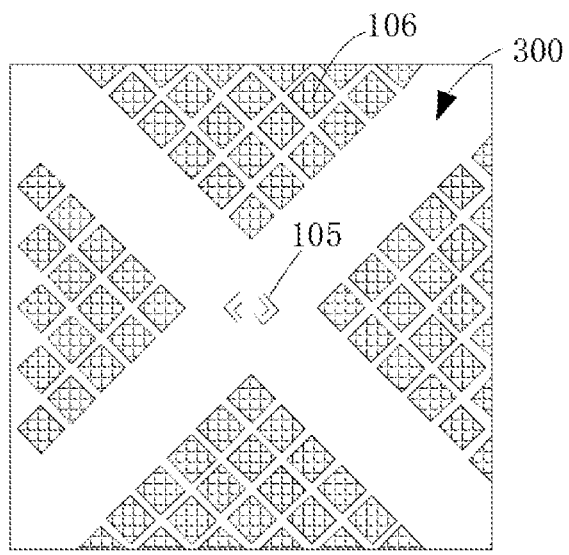
FIG. 3 is a schematic diagram showing a planar structure of a first metal layer according to an embodiment of the present disclosure.
Figure 4:
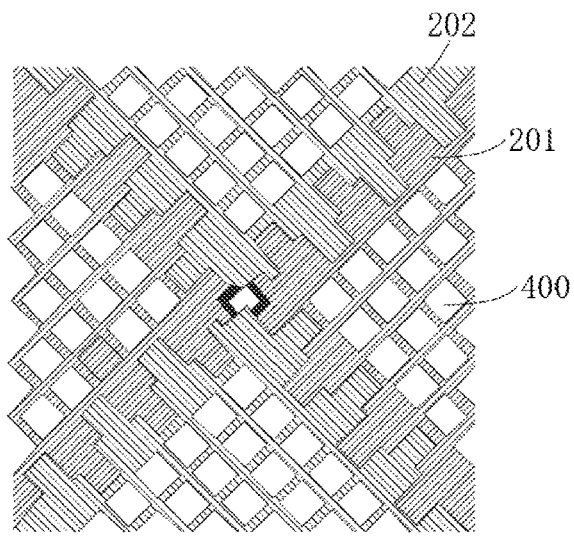
FIG. 4 is a schematic diagram showing a planar structure of a second metal layer according to an embodiment of the present disclosure.

As shown in FIG. 3 and FIG. 4, FIG. 3 is a schematic diagram showing a planar structure of a first metal layer according to an embodiment of the present disclosure, and FIG. 4 is a schematic diagram showing a planar structure of a second metal layer according to an embodiment of the present disclosure. The first metal layer includes the bridging layer 105 and the first floating pattern 106. The second metal layer includes the driving electrode 201 and the sensing electrode 202.

Wherein, in conjunction with FIG. 3 and FIG. 4, the first floating pattern 106 corresponds to the second floating pattern 400 of the touch electrode of the second metal layer. Meanwhile, the interaction area where the driving electrode 201 and the sensing electrode 202 of the second metal layer intersect corresponds to a blank area 300 of the first metal layer, and the first floating pattern 106 overlaps with a projection of the second floating pattern 400 in a vertical direction.

Figure 5:
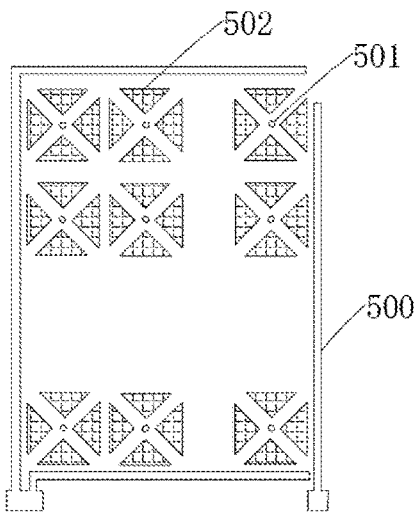
FIG. 5 is a schematic diagram showing an electrode connection of a first metal layer inside a display panel according to an embodiment of the present disclosure.
Figure 6:
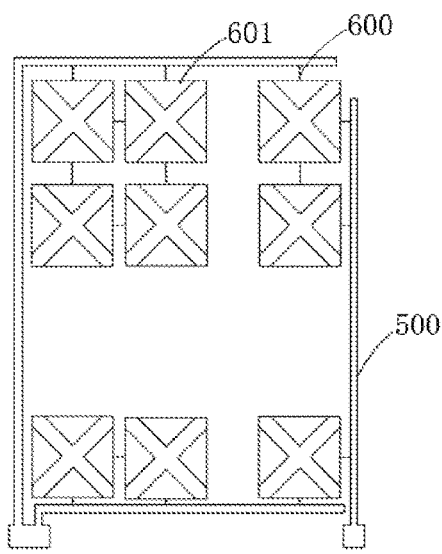
FIG. 6 is a schematic diagram showing an electrode connection of a second metal layer inside a display panel according to an embodiment of the present disclosure.
Figure 7:
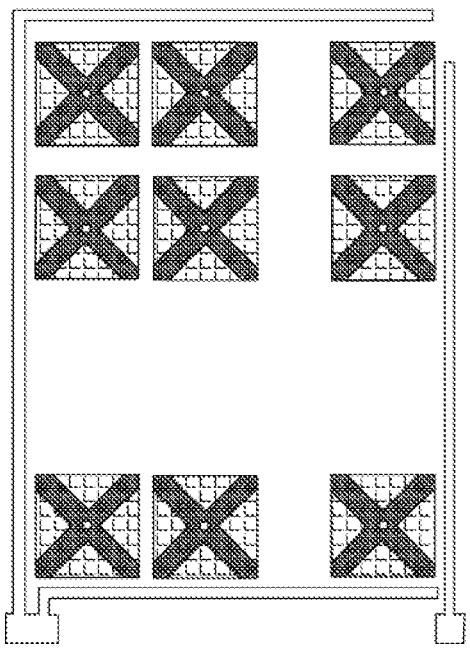
FIG. 7 is a schematic plan view of an entire touch electrode inside a display panel according to an embodiment of the present disclosure.

Furthermore, in conjunction with relationships of electrode connections related to the touch electrode in the display panel, as shown in FIG. 5, FIG. 6, and FIG. 7, FIG. 5 is a schematic diagram showing an electrode connection of a first metal layer inside a display panel according to an embodiment of the present disclosure, FIG. 6 is a schematic diagram showing an electrode connection of a second metal layer inside a display panel according to an embodiment of the present disclosure, and FIG. 7 is a schematic plan view of an entire touch electrode inside a display panel according to an embodiment of the present disclosure.

When designing peripheral wires of the display panel, a double-layer wiring design used by the first metal layer and the second metal layer is adopted by the peripheral wires. Specifically, for wires of the first metal layer 502, the first floating pattern inside the first metal layer 502 and a bridge point 501 located at the bridging layer are independent of each other, and are not connected to peripheral transmission lines 500. Accordingly, it ensures mutual independence of the first metal layer 502. Meanwhile, for the second metal layer 601, it is connected to the peripheral transmission line 500 by a lead 600 one by one, and the second metal layer 601 is disposed on the first metal layer 502.

In order to prevent short circuits between the touch electrodes, in the embodiment of the present disclosure, the second floating pattern inside the second metal layer 601 is disposed at a same layer as the bridging point 501 inside the first metal layer 502. Therefore, from a top view plane, there is no fracture structure at the touch electrode inside the second metal layer 601 and the first floating pattern corresponding to the first metal layer 502 from the top view plane, thereby preventing the short circuit between the touch electrode and the first floating pattern, solving a problem of abnormal single-node capacitance values inside the touch electrode, and effectively improving uniformity of capacitance values of the touch panel.

Figure 8:
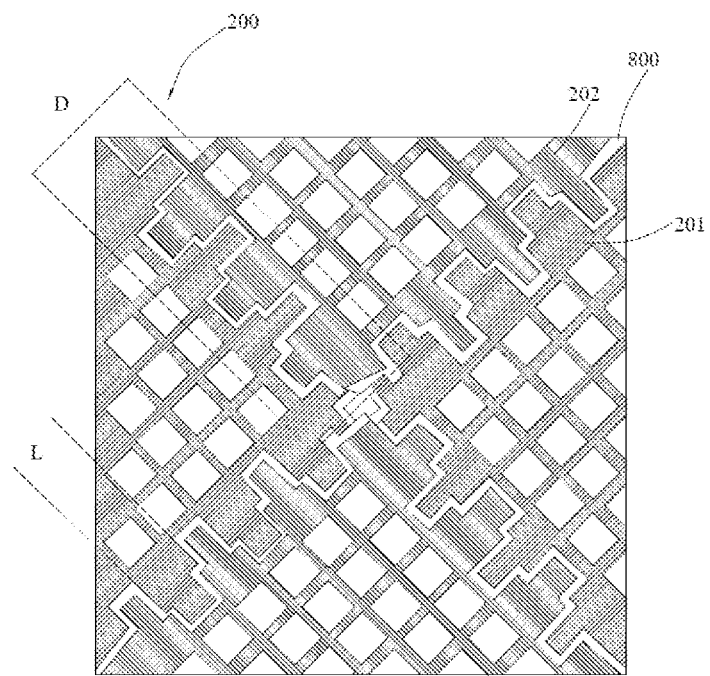
FIG. 8 is a schematic diagram showing another touch electrode according to an embodiment of the present disclosure.

Preferably, as shown in FIG. 8, it is a schematic diagram showing another touch electrode according to an embodiment of the present disclosure, and in conjunction with the schematic diagram of the electrode structure shown in FIG. 2. In the embodiment of the present disclosure, the floating electrode corresponding to the second floating pattern of the second metal layer is disposed along the vertical direction corresponding to the first metal layer, and the two overlap in the vertical direction. Further, in the embodiment of the present disclosure, a separating area 800 is further disposed in the interaction area 200, and the driving electrode 201 and the sensing electrode 202 are isolated from each other by the separating area 800.

In the interaction area 200, the driving electrode 201 and the sensing electrode 202 are shaped as the zigzag or wave. Therefore, the separating area 800 is also shaped as the zigzag or wave to correspond to the driving electrode 201 and the sensing electrode 202. Designs and working rules of the touch electrodes with other structures are same as those in FIG. 2, and it will not be described in detail here.

Preferably, for the separating area 800, in order to ensure touch capacitance values between the touch electrodes, a width of the separating area 800 is ranged from 10 um to 100 um. Furthermore, in the interaction area 200, a width of the zigzag structure or a depth of the wave structure D is greater than 400 um and a width of which is L>200 um, thereby effectively increasing an interaction area of a touch sensing area and improving the touch effects of the touch electrodes.

In the embodiment of the present disclosure, the first floating pattern corresponding to the first metal layer overlaps with the blank areas of the second floating pattern corresponding to the second metal layer in the vertical direction, so that there is no fracture structure in the entire touch electrode from the top view plan. Further, the separating area 800 is disposed between the touch electrodes, thereby ensuring optical uniformity, increasing a distance between the driving electrode and the sensing electrode inside the second metal layer, and greatly reducing the problem of abnormal single-node capacitance values caused by the short circuits between metals of the touch electrodes, and effectively improving the display effects and quality of the display panel.

Further, the embodiment of the present disclosure further provides a display device including the display panel provided by the embodiment of the present disclosure, wherein the electrode structures inside the display panel are the electrode structures provided by the embodiment of the present disclosure. The display device may be any product or component with a display function, such as a mobile phone, a computer, and a display.

The display panel and the display device provided by the embodiments of the present disclosure are described in detail above. The descriptions of the above embodiments are only used to help understand the technical solutions and core ideas of the present disclosure. Persons skilled in this art should understand that the technical solutions described in the foregoing embodiments can still be modified. These modifications or replacements do not make essence of corresponding technical solutions to depart from the scope of the technical solutions of the embodiments of the present disclosure.

What is claimed is:

1. A display panel, comprising:
a light-emitting layer;
a first insulation layer, disposed on the light-emitting layer;
a first metal layer, disposed on the first insulation layer;
a second insulation layer, disposed on the first insulation layer and covering the first metal layer;
a second metal layer, disposed on the second insulation layer, wherein the first metal layer comprises a bridge layer and a first floating pattern, the bridge layer and the first floating pattern are insulated from each other, the second metal layer comprises a driving electrode and a sensing electrode, the driving electrode and the sensing electrode are disposed in a same layer, and the driving electrode is electrically connected to the sensing electrode via the bridge layer; and
a via structure, wherein the bridge layer is connected to the driving electrode and the sensing electrode by the via structure,
wherein the driving electrode arranged as a convex-concave structure corresponds to the sensing electrode arranged as a convex-concave structure at an interaction area where the driving electrode and the sensing electrode intersect,
wherein the display panel further comprises a space area, and the space area is disposed between the driving electrode and the sensing electrode corresponding to the interaction area.

2. The display panel as claimed in claim 1, wherein a protrusion depth or a depression depth of the convex-concave structure is greater than 400 um, and a protrusion width or a depression width of the convex-concave structure is greater than 200 um.

3. The display panel as claimed in claim 1, wherein a width of the space area is 10 um to 100 um.

4. The display panel as claimed in claim 1, wherein the driving electrode or the sensing electrode comprises a touch electrode with a grid structure and a second floating pattern with the grid structure, and the touch electrode and the second floating pattern are insulated from each other.

5. The display panel as claimed in claim 4, wherein the grid structure comprises shapes of diamond, circle, or triangle.

6. The display panel as claimed in claim 4, wherein the second floating pattern is disposed on an area corresponding to the bridge layer.

7. The display panel as claimed in claim 4, wherein a projection of the first floating pattern overlap with a projection of the second floating pattern corresponding to the first floating pattern on the first metal layer.

8. A display panel, comprising:
- a light-emitting layer;
- a first insulation layer, disposed on the light-emitting layer;
- a first metal layer, disposed on the first insulation layer;
- a second insulation layer, disposed on the first insulation layer and covering the first metal layer; and
- a second metal layer, disposed on the second insulation layer;
- wherein the first metal layer comprises a bridge layer and a first floating pattern, the bridge layer and the first floating pattern are insulated from each other, the second metal layer comprises a driving electrode and a sensing electrode, the driving electrode and the sensing electrode are disposed in a same layer, and the driving electrode is electrically connected to the sensing electrode via the bridge layer,
- wherein the driving electrode arranged as a convex-concave structure corresponds to the sensing electrode arranged as a convex-concave structure at an interaction area where the driving electrode and the sensing electrode intersect,
- wherein the display panel further comprises a space area, and the space area is disposed between the driving electrode and the sensing electrode corresponding to the interaction area.

9. The display panel as claimed in claim 8, wherein a protrusion depth or a depression depth of the convex-concave structure is greater than 400 um, and a protrusion width or a depression width of the convex-concave structure is greater than 200 um.

10. The display panel as claimed in claim 8, wherein a width of the space area is 10 um to 100 um.

11. The display panel as claimed in claim 8, wherein the driving electrode or the sensing electrode comprises a touch electrode with a grid structure and a second floating pattern with the grid structure, and the touch electrode and the second floating pattern are insulated from each other.

12. The display panel as claimed in claim 11, wherein the grid structure comprises shapes of diamond, circle, or triangle.

13. The display panel as claimed in claim 11, wherein the second floating pattern is disposed on an area corresponding to the bridge layer.

14. The display panel as claimed in claim 11, wherein a projection of the first floating pattern overlap with a projection of the second floating pattern corresponding to the first floating pattern on the first metal layer.

15. A display device, comprising:
- a light-emitting layer;
- a first insulation layer, disposed on the light-emitting layer;
- a first metal layer, disposed on the first insulation layer;
- a second insulation layer, disposed on the first insulation layer and covering the first metal layer; and
- a second metal layer, disposed on the second insulation layer;
- wherein the first metal layer comprises a bridge layer and a first floating pattern, the bridge layer and the first floating pattern are insulated from each other, the second metal layer comprises a driving electrode and a sensing electrode, the driving electrode and the sensing electrode are disposed in a same layer, and the driving electrode is electrically connected to the sensing electrode via the bridge layer,
- wherein the driving electrode arranged as a convex-concave structure corresponds to the sensing electrode arranged as a convex-concave structure at an interaction area where the driving electrode and the sensing electrode intersect,
- wherein the display panel further comprises a space area, and the space area is disposed between the driving electrode and the sensing electrode corresponding to the interaction area.

* * * * *